United States Patent
Khoshamouz

(10) Patent No.: US 10,477,693 B2
(45) Date of Patent: Nov. 12, 2019

(54) METHOD FOR MANUFACTURING A PRINTED CIRCUIT BOARD ELEMENT AND PRINTED CIRCUIT BOARD ELEMENT

(71) Applicant: Schweizer Electronic AG, Schramberg (DE)

(72) Inventor: Ali Khoshamouz, Schramberg-Sulgen (DE)

(73) Assignee: SCHWEIZER ELECTRONIC AG, Schramberg (DE)

( * ) Notice: Subject to any disclaimer, the term of this patent is extended or adjusted under 35 U.S.C. 154(b) by 0 days.

(21) Appl. No.: 15/645,821

(22) Filed: Jul. 10, 2017

(65) Prior Publication Data

US 2018/0020552 A1 Jan. 18, 2018

(30) Foreign Application Priority Data

Jul. 12, 2016 (DE) .......................... 10 2016 212 666

(51) Int. Cl.
*H05K 1/18* (2006.01)
*H05K 3/10* (2006.01)
(Continued)

(52) U.S. Cl.
CPC ........... *H05K 3/103* (2013.01); *G01R 15/207* (2013.01); *H05K 1/0204* (2013.01);
(Continued)

(58) Field of Classification Search
CPC .............. G01R 15/202; G01R 19/0092; H05K 1/0204; H05K 1/0263; H05K 1/0269;
(Continued)

(56) References Cited

U.S. PATENT DOCUMENTS

2004/0060724 A1* 4/2004 Hwang .................. H01L 23/538
174/117 FF
2006/0033487 A1* 2/2006 Nagano ................ G01R 15/202
324/117 H
(Continued)

FOREIGN PATENT DOCUMENTS

| DE | 103 01 682 | 8/2004 |
| EP | 2 437 072 | 4/2012 |
| JP | 10293141 | * 11/1998 |

*Primary Examiner* — Yuriy Semenenko
(74) *Attorney, Agent, or Firm* — Shlesinger Arkwright & Garvey LLP

(57) ABSTRACT

The method for manufacturing a printed circuit board element (10) having an inlay (16) and a current sensor (30) for determining a current flowing in the inlay (16), wherein, for the improvement of the positional accuracy of the inlay (16) relative to the current sensor (30), the method comprises the following steps:
  providing a layer (12) of printed circuit board material having a recess (14),
  providing an inlay (16) having an inlay outline,
  inserting the inlay (16) in the recess (14);
  embedding the inlay (16) in the recess (14);
  completing and laminating the layered printed circuit board structure;
  applying at least two alignment markings (M1, M2) on an uppermost printed circuit board layer (AL);
  forming a defined cross-section tapering (S) on the inlay outline, the tapering being aligned with the at least two alignment markings (M1, M2);
  applying an assembly marking for a current sensor (30) on an uppermost printed circuit board layer (AL), the assembly marking being aligned with the at least two alignment markings (M1, M2).

13 Claims, 3 Drawing Sheets

(51) Int. Cl.
*H05K 1/02* (2006.01)
*H05K 3/30* (2006.01)
*H05K 3/46* (2006.01)
*G01R 15/20* (2006.01)
*G01R 19/00* (2006.01)
*H05K 3/00* (2006.01)

(52) U.S. Cl.
CPC ......... *H05K 1/0263* (2013.01); *H05K 1/0265* (2013.01); *H05K 1/181* (2013.01); *H05K 3/303* (2013.01); *H05K 3/4644* (2013.01); *G01R 15/202* (2013.01); *G01R 19/0092* (2013.01); *H05K 1/0203* (2013.01); *H05K 1/0269* (2013.01); *H05K 3/0047* (2013.01); *H05K 2201/09036* (2013.01); *H05K 2201/09063* (2013.01); *H05K 2201/09827* (2013.01); *H05K 2201/09918* (2013.01); *H05K 2201/10151* (2013.01); *H05K 2201/10416* (2013.01); *H05K 2203/166* (2013.01)

(58) Field of Classification Search
CPC ......... H05K 1/181; H05K 2201/09036; H05K 2201/09827; H05K 2201/09918; H05K 2201/10151; H05K 2203/166; H05K 3/0047; H05K 3/103
See application file for complete search history.

(56) References Cited

U.S. PATENT DOCUMENTS

| | | | |
|---|---|---|---|
| 2009/0304324 A1* | 12/2009 | Kim | G02B 6/4224 385/14 |
| 2012/0081110 A1* | 4/2012 | Racz | G01R 15/202 324/252 |
| 2014/0266269 A1* | 9/2014 | Ausserlechner | G01R 1/203 324/713 |
| 2017/0146572 A1* | 5/2017 | Urankar | G01R 15/181 |
| 2018/0156845 A1* | 6/2018 | Suzuki | G01R 15/202 |

* cited by examiner

METHOD FOR MANUFACTURING A PRINTED CIRCUIT BOARD ELEMENT AND PRINTED CIRCUIT BOARD ELEMENT

TECHNICAL FIELD

The present invention relates to the field of manufacture of printed circuit boards, and specifically the manufacture of printed circuit boards having an inlay and a current sensor for determining a current flowing in the inlay. Specifically, the present invention relates to a method for manufacturing a printed circuit board element having an inlay and a current sensor for determining a current flowing in the inlay, and to a correspondingly manufactured printed circuit board element or correspondingly manufactured printed circuit board.

DESCRIPTION OF THE PRIOR ART

In up-to-date printed circuit boards, high currents are generated in the printed conductive tracks. As the trend is moving toward smaller component sizes with simultaneously higher currents, more energy must be dissipated from the material of the printed circuit board in the form of heat. One concept for dissipating higher thermal currents from the printed conductor involves the embedding of inlays in the printed circuit board matrix. The inlays are formed of a material which has a very high thermal conductivity, usually of copper. Due to their size, the inlays can also be employed as a high-current printed conductor.

Users of such printed circuit boards wish to measure the current flowing in the inlay as accurately as possible. The more precise the positioning of the sensor in relation to the inlay, the more accurate the current measurement. To this end, sensors are oriented in accordance with a marking which is applied to or on the outer layer. Manufacturing tolerances, together with minor displacements of the inlay during the lamination process, can result in an offset of the inlay.

EP 2 437 072 A2 discloses the application of a current sensor to a printed circuit board for the measurement of the current flowing in a printed conductor is known. The known current measuring device comprises a printed circuit board having a printed conductor and a current sensor for measuring the current flowing in the printed conductor, which is arranged above the printed conductor.

DE 103 01 682 B4 discloses the machining of shunt resistors using a milling cutter subsequent to their application on a carrier, in order to achieve the setting of a specific resistance value.

SUMMARY OF THE INVENTION

In contrast thereto, the invention proposes a manufacturing method and a printed circuit board element as disclosed herein.

In the present application, the term "printed circuit board element" is to be understood as a layered structure which can be employed per se as a (self-contained) printed circuit board, or as a semi-finished component which is used in a further printed circuit board structure. In the following description, the terms "printed circuit board" and "printed circuit board element" are fundamentally used as mutually equivalent.

According to the concept of the invention, the inlay or high-current printed conductive track/conductor is firstly applied to the printed circuit board or printed circuit board element, and is attached therein. This is achieved, for example, by the application of further printed circuit board layers, followed by a lamination of the layered structure. At least two alignment markings are applied to an uppermost layer of the layered structure. In alignment with the alignment markings thus applied, a cross-section tapering (reduction of the cross-section) is then formed in the inlay. After the formation of the cross-section tapering, an assembly (or population/equipment) marking for the current sensor is applied to the uppermost printed circuit board layer, also aligned with the alignment markings thus applied. The (semi-finished) printed circuit board element thus produced is then, or thereafter, equipped with the current sensor, either on or in alignment with the assembly marking. Alternatively, equipment or assembly can proceed immediately, with no assembly marking.

In the present case, the term "cross-section tapering" is to be understood as any type of (even minimal) removal of material from the inlay, which is appropriate for the construction of a defined edge (precision edge) and/or for the formation of a taper which is conducive to an increase in current.

The invention thus provides for the reproducible formation of a precision edge on the inlay, as a reference edge for the measuring sensor for the execution of measurement, only after the embedding of the inlay in the printed circuit board, for example by means of a milling cutter or laser. The more accurate relative positioning of the current sensor to the inlay permits a current measurement with reduced tolerances. The precision edge thus constitutes a reference edge of the inlay for the measuring sensor.

An advantageous feature of the method according to the invention is observed in that sources of error, such as offsets and indentations associated with stamping, together with inexact external outlines of the inlay, are of no significance in the positioning of the inlay. By means of the invention, it is also prevented that tolerances and offsets during printed circuit board manufacture and the manufacture of the inlay in general, and superordinately for the entire process chain, need to be configured within tighter margins.

Thus, according to the invention, a highly precise orientation of the inlay relative to the current sensor is achieved. Moreover, by the subsequent processing of the inlay, a comparatively sharply-defined edge is formed, which contributes to a superior quality of measurement.

The at least two alignment markings are, for example, optical markings. These optical markings can, for example, be markings which are formed by etching during the production of the external conductor pattern. If the fitting position for the measuring sensor is also produced during this process, particularly accurate positional matching will be achieved. However, other markings are also possible. The number of markings is subject to the discretion of a person skilled in the art. Typically, two or three markings are employed, although a higher number is also possible.

The further processing of the inlay can be executed, for example, by means of milling or laser cutting, or by another appropriate technique.

Further advantages and configurations of the invention become apparent from the description and from the attached drawing.

It is understood that the aforementioned characteristics and features, and those described hereinafter, can not only be applied in the respective combination indicated, but also in other combinations, or in isolation, without departing from the scope of the present invention.

The invention is schematically represented in the drawing with reference to an exemplary embodiment, and is described in detail hereinafter, with reference to the drawing.

DETAILED DESCRIPTION

Figure 1:
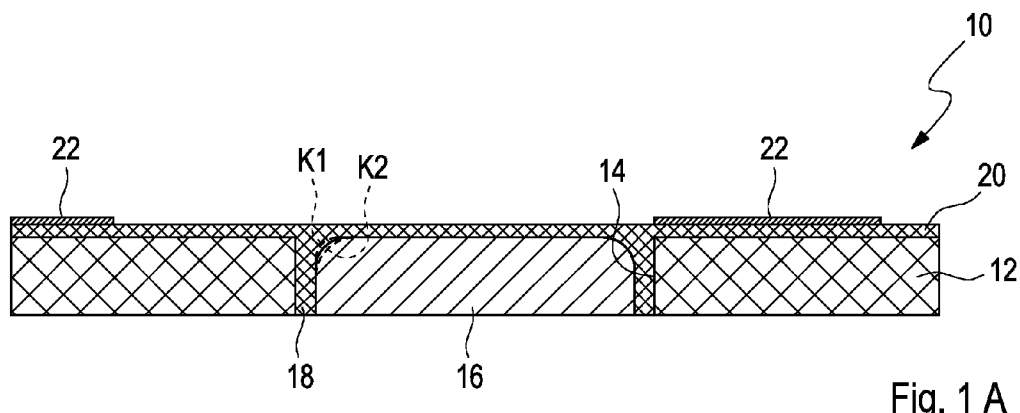
FIGS. 1A to 1C represent a sequence for the manufacture of a printed circuit board element according to the invention, in a lateral sectional representation according to the section line I-I in FIG. 2.
Figure 1:
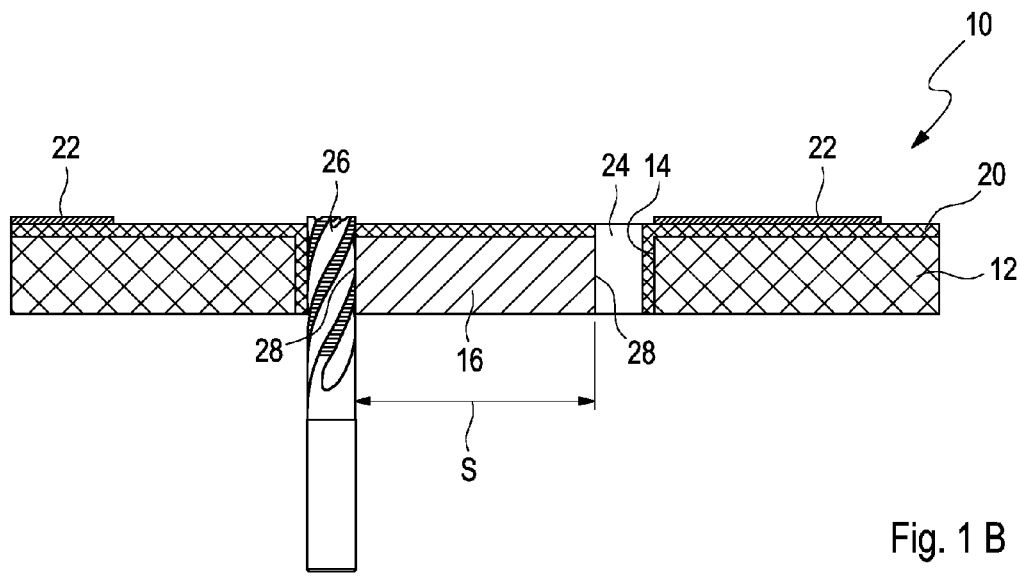
Figure 1:
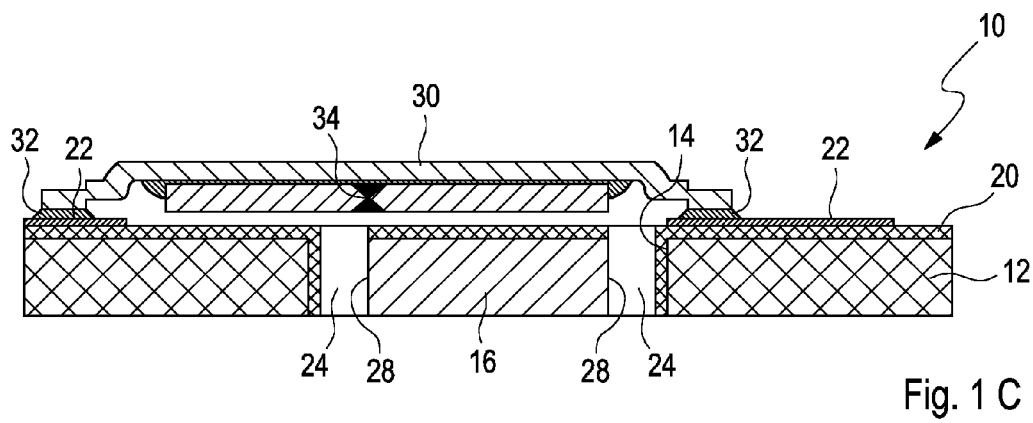

Identical and similar characteristics represented in the individual Figures are identified by the same reference numerals.

FIGS. 1A to 1C represent a sequence for the manufacture of a printed circuit board element 10 according to the invention. Hereinafter, in the interests of simplicity, reference is made to a "printed circuit board"; this term includes both a self-contained printed circuit board and a semi-finished component which is used in a further printed circuit board structure.

For the manufacture of the printed circuit board 10, a layer 12 having a recess or cut-out 14 and an inlay 16 are provided. The layer 12 is, for example, a nonelectrically-conductive inner layer, formed of a material which is known per se to a person skilled in the art (for example FR4). In combination with the recess 14, the layer 12 forms a "receptacle". The layer 12 can comprise a layered structure of a plurality of further layers, which is not represented in the drawing, and has no influence upon the method of operation of the invention or the manufacturing method according to the invention. The inlay 16 is comprised, for example, of copper or another appropriate material. Inlays are also known per se to a person skilled in the art.

The inlay 16 is inserted in the cut-out 14 provided for this purpose in the layer 12. To this end, the cut-out 14 has a shape which is adapted to the shape of the inlay 16 (c.f. the plan view represented in FIG. 2), such that, with the inlay 16 inserted, a resulting gap 18 between an inner wall of the cut-out 14 and the sidewalls of the inlay 16 is as uniform as possible.

A layer of resin material (Prepreg) 20 is applied to the layer 12 (a plurality of layers can also be applied), and the layered structure is compressed or laminated. During the lamination process, the liquefied resin material of the layer 20 also flows into the gap 18 and fills the latter—in a manner which is also known to a person skilled in the art—as illustrated in the representation shown in FIG. 1A.

On the resin layer 20, printed conductors 22 can also be provided, which can specifically be formed of copper, and are applied in a manner which is known to a person skilled in the art, for example by means of a copper foil and a subsequent etching process.

Figure 2:
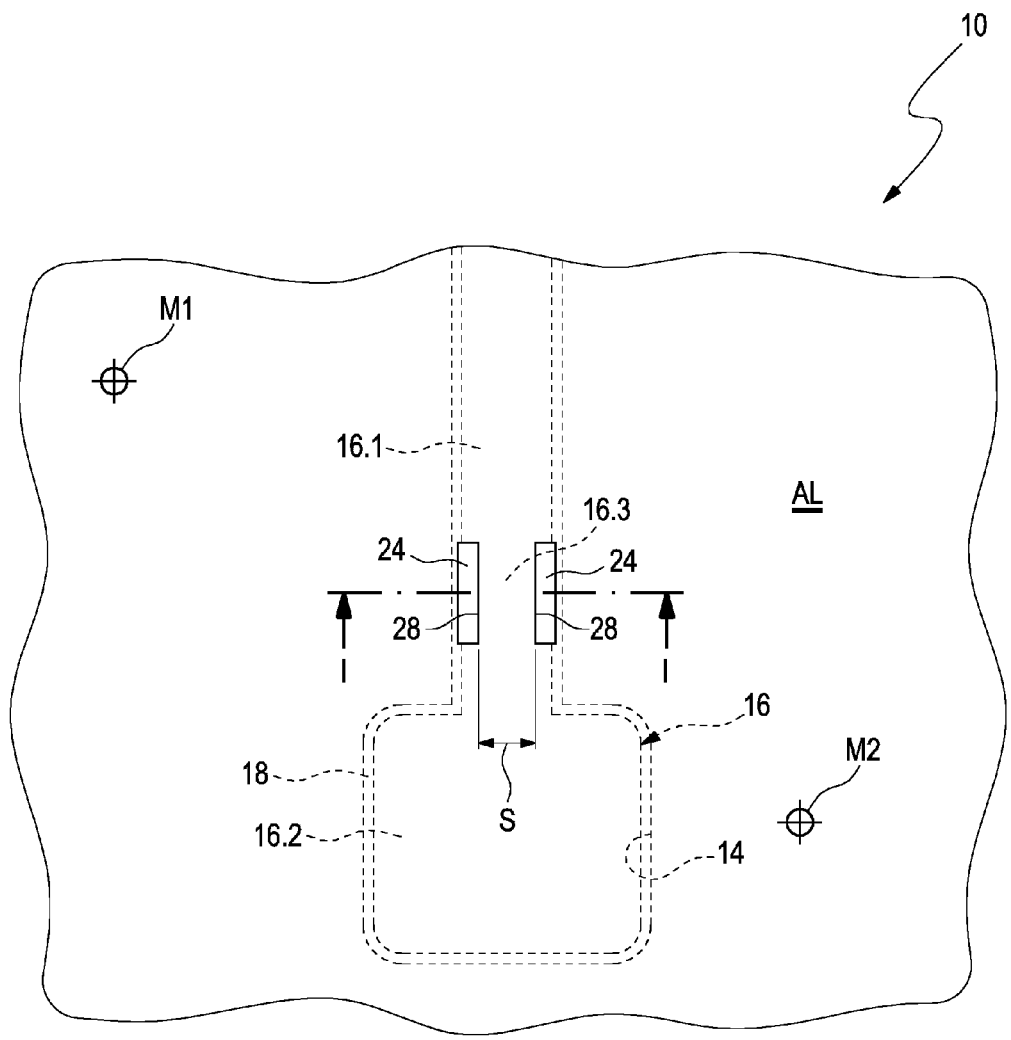
FIG. 2 shows a plan view of a section of the printed circuit board element according to the invention, corresponding to the sectional representation of FIGS. 1A to 1C.

Moreover, according to the invention, alignment markings M1, M2 are applied to the one uppermost printed circuit board layer AL (c.f. FIG. 2). These alignment markings can be markings which are required, in any event, for the construction of the conductor pattern.

In alignment with these alignment markings M1, M2, a specific further processing of the inlay 16 is executed such that a cross-section tapering S of the inlay, or a defined edge 28 is formed. To this end, inlay material is removed in order to form a slot or, in general, an indentation 24. This further processing can be executed by known techniques, for example using a milling cutter 26 (c.f. FIG. 2), a laser or the like. This further processing corrects any offset of the inlay relative to the marking (of the type which can result, for example, from the lamination process). The further processing also corrects any distortion of the inlay edge (of the type which can result, for example, from the stamping process). Edge deviations of this type are represented for exemplary purposes in FIG. 1A by the dashed edge profiles K1, K2.

In the exemplary embodiment represented in FIGS. 1A to 1C, indentations 24 are applied to both longitudinal sides of the inlay 16. Consequently, on the grounds of the resulting defined width of the inlay web 16.3 thus formed, an exceptionally high quality of measurement is additionally achieved, as the increased current density associated with the cross-section tapering and the defined width gives rise to an increased and spatially-identified magnetic field.

Over the inlay web 16.3 formed by the indentation(s) 24, a current sensor 30 is then fitted to the uppermost printed circuit board layer (or outer layer) AL (c.f. also FIG. 3), which is in turn aligned with the alignment markings M1, M2. By means of the alignment of both the inlay outline (i.e. the precision edges 28 formed by the indentations 24) and the current sensor 30 on the same alignment markings M1, M2, the current sensor 30 (i.e. a measuring point 34 of the current sensor 30) can be positioned in a highly precise manner. Positioning can be executed, for example (as represented in the Figures), either over a precision edge 28 formed on the inlay 16 (in the representation shown in the figures, the left-hand edge 28) or, for example, centrally between the two edges 28, above the inlay web 16.3. For the purposes of bonding, for example, contact points 32 can be provided on the copper conductors 22 of the uppermost layer AL.

Figure 3:
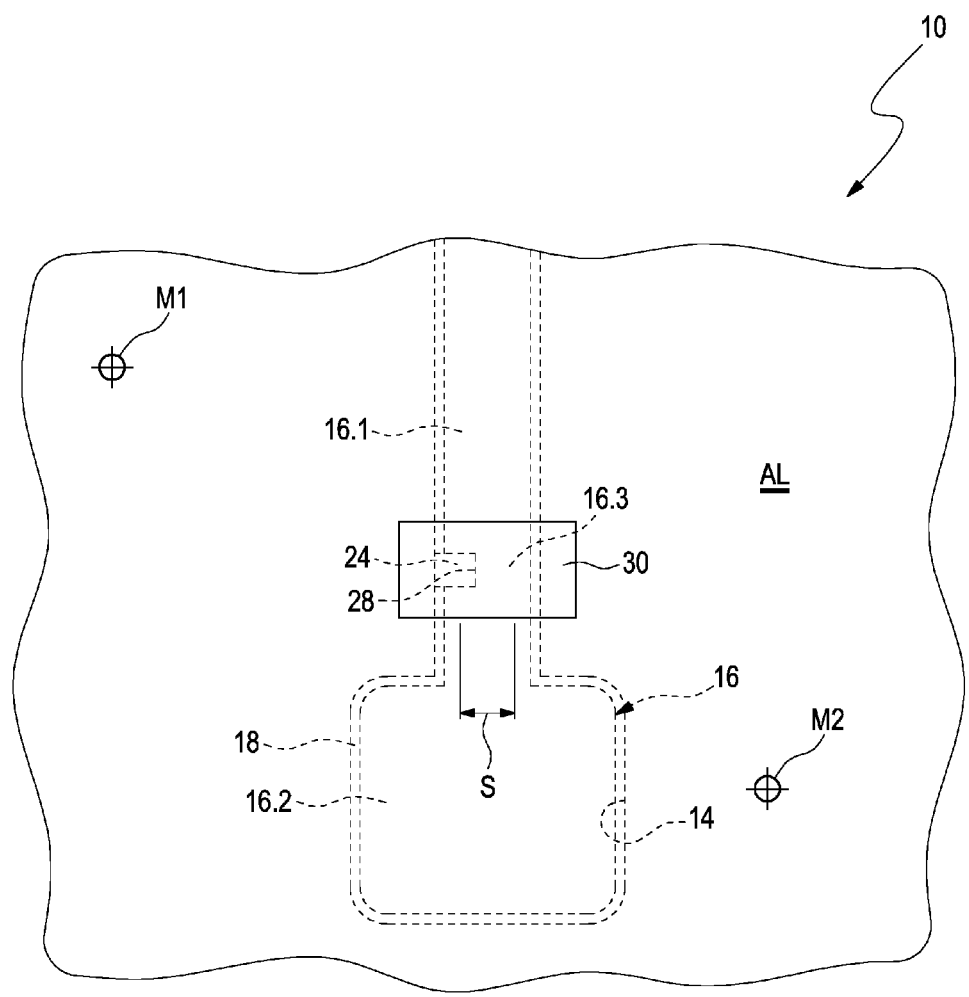
FIG. 3 shows a plan view of a section of a printed circuit board element according to the invention, in a variant of embodiment.

FIG. 3 shows an exemplary embodiment of a printed circuit board element 10 according to the invention, wherein identical elements are identified by the same reference symbols. In the exemplary embodiment represented, only one indentation 24 is provided, in the form of a slot which extends essentially perpendicularly to the longitudinal direction of the inlay 16. This results in a greater cross-section tapering S of the inlay web 16.3, and thus a stronger magnetic field at this point.

As a current sensor, any known sensor for current-measuring applications of this type can be employed, for example a (multi-dimensional) Hall effect sensor.

Orientation during the formation of the indentation or slot and the fitting of the current sensor is achieved by known methods, for example by means of a CCD camera which, for example, is a constituent element of a milling machine employed for the formation of the slot.

By means of the invention, a reproducible and significant improvement in the positional accuracy of the inlay relative to the current sensor is thus achieved. An offset of the inlay associated with tolerances and/or produced by the lamination process can be compensated with greater accuracy. The taper of the inlay according to the invention to a residual web thickness results in a highly precise magnetic field measurement, associated with the orientation of the current sensor with the same markings.

The cross-section tapering according to the invention thus results firstly in the formation of a defined inlay edge, which permits a precise positioning of the current sensor relative to said edge, and moreover—in the event of a sufficient reduction—can generate the inlay taper described, with the consequent amplification of the signal to be measured. As already described above, the term "cross-section tapering", in the context of the present invention, encompasses the formation of a defined edge and/or the formation of an inlay taper.

In the present case, the terms "indentation" and "slot" encompass any type of (blind or through) bore which, by the removal of part of the inlay material, is appropriate for the formation of a reference edge for the orientation of the current sensor.

The invention thus comprises a printed circuit board element having an inlay and a current sensor for determining a current flowing in the inlay, wherein the inlay has a cross-section tapering which is aligned with at least two alignment markings, formed after a lamination of the printed circuit board, and is aligned with the at least one current sensor.

As an intermediate product, the invention also comprises a printed circuit board element (semi-finished product) having an inlay and an assembly marking for a current sensor for determining a current flowing in the inlay, wherein the inlay has a cross-section tapering which is aligned with at least two alignment markings, formed after a lamination of the printed circuit board, with which the assembly marking is aligned.

The invention moreover comprises an aforementioned printed circuit board element having an inlay and an assembly marking for a current sensor for determining a current flowing in the inlay, which is populated/equipped with a current sensor for determining a current flowing in the inlay, on the assembly marking. Assembly is preferably executed such that the current sensor is positionally aligned with the cross-section tapering (or the defined edge).

The step of applying in the method according to the invention can either comprise the applying of an assembly marking which is aligned with the at least two alignment markings for a current sensor on an uppermost printed circuit board layer, or the applying of a current sensor which is aligned with the least two alignment markings on an uppermost printed circuit board layer. In the first-mentioned alternative, assembly with the current sensor is completed thereafter, or at a subsequent time (specifically by the client).

The invention claimed is:

1. A method for manufacturing a printed circuit board element having an inlay and a current sensor for determining a current flowing through the inlay, the method comprises the following steps:
   providing a layer of printed circuit board material having a recess;
   providing the inlay having an inlay outline;
   inserting the inlay in the recess;
   embedding the inlay in the recess;
   completing and laminating the printed circuit board material;
   applying two alignment markings on an uppermost printed circuit board layer;
   forming a cross-section tapering on the inlay outline to form a precision edge aligned with the two alignment markings;
   applying the precision edge as a reference edge for assembly of the current sensor on an uppermost printed circuit board layer.

2. The method according to claim 1, wherein between the steps of forming the cross-section tapering and applying the current sensor, further printed circuit board layers are applied and laminated.

3. The method according to claim 1, wherein forming of the cross-section tapering is performed by means of milling or laser cutting.

4. The method according to claim 1, wherein the embedding of the inlay is performed by means of lamination or compression.

5. The method according to claim 1, wherein the cross-section tapering is performed by means of at least one indentation or slot.

6. The method according to claim 5, wherein the cross-section tapering is performed by means of a single-sided indentation or slot, or wherein the cross-section tapering is executed by means of two-sided indentations or slots.

7. The method according to claim 1, wherein a measuring point of the current sensor is arranged over the precision edge of the cross-section tapering, or centrally above the cross-section tapering.

8. A printed circuit board element, comprising:
   an inlay for a current sensor for determining a current flowing in the inlay; and
   the inlay has a cross-section tapering having a precision edge which is aligned with two alignment markings disposed on an uppermost printed circuit board layer.

9. The printed circuit board element according to claim 8, wherein the printed circuit board element is equipped with a current sensor for determining a current flowing in the inlay.

10. The printed circuit board element according to claim 8, wherein the cross-section tapering is formed by at least one indentation or slot.

11. The printed circuit board element according to claim 9, wherein the precision edge constitutes a reference edge with respect to which reference edge a measuring point of the current sensor is aligned.

12. The printed circuit board element according to claim 11, wherein the measuring point of the current sensor is arranged over the precision edge of the cross-section tapering, or centrally above the cross-section tapering.

13. A printed circuit board having the printed circuit board element according to claim 9 fitted therein.

* * * * *